United States Patent
Chen et al.

(10) Patent No.: US 9,360,724 B2
(45) Date of Patent: Jun. 7, 2016

(54) ARRAY SUBSTRATE AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Xi Chen, Beijing (CN); Xiaoxiang Zhang, Beijing (CN); Jianfeng Yuan, Bejing (CN)

(73) Assignees: BOE Technology Group Co., Ltd., Beijing (CN); Beijing BOE Display Technology Co., Ltd., Beijing (CN)

( * ) Notice: Subject to any disclaimer, the term of this patent is extended or adjusted under 35 U.S.C. 154(b) by 0 days.

(21) Appl. No.: 14/429,259

(22) PCT Filed: Aug. 8, 2014

(86) PCT No.: PCT/CN2014/084018
§ 371 (c)(1),
(2) Date: Mar. 18, 2015

(87) PCT Pub. No.: WO2015/113392
PCT Pub. Date: Aug. 6, 2015

(65) Prior Publication Data
US 2016/0041442 A1    Feb. 11, 2016

(30) Foreign Application Priority Data
Jan. 29, 2014    (CN) .......................... 2014 1 0043732

(51) Int. Cl.
*H01L 27/12* (2006.01)
*H01L 27/088* (2006.01)
(Continued)

(52) U.S. Cl.
CPC ........ *G02F 1/136227* (2013.01); *G02F 1/1345* (2013.01); *G02F 1/134309* (2013.01);*G02F 1/136286* (2013.01); *H01L 27/124* (2013.01); *H01L 27/1225* (2013.01); *G02F 1/1337* (2013.01); *G02F 1/1343* (2013.01)

(58) Field of Classification Search
CPC .............. H01L 27/124; H01L 27/1225; H01L 27/1252; G02F 1/136227; G02F 1/136286; G02F 1/134309; G02F 1/1345; G02F 1/1337; G02F 1/1343; G02F 1/1362
USPC ....................... 257/43, 59, 60, 71, 72, E27.06, 257/E27.132, E29.291, E33.012, E33.053, 257/E21.535; 345/92, 173, 174, 206; 349/54, 123, 129, 138, 139; 438/24, 438/29, 30, 34, 158
See application file for complete search history.

(56) References Cited

U.S. PATENT DOCUMENTS 6,191,832 B1 * 2/2001 Nakakura ......... G02F 1/136286
349/52
2008/0044982 A1 * 2/2008 You ......................... H01L 27/12
438/443
(Continued)

FOREIGN PATENT DOCUMENTS

CN    1497310 A    5/2004
CN    1797075 A    7/2006
(Continued)

OTHER PUBLICATIONS

Oct. 27, 2014—(WO) ISR—App. No. PCT/CN14/081237—with Eng Tran of Written Opinion.

*Primary Examiner* — Dao H Nguyen
(74) *Attorney, Agent, or Firm* — Banner & Witcoff, Ltd.

(57) ABSTRACT

An array substrate and a display device are provided. The array substrate comprises: a plurality of gate lines arranged in parallel, a plurality of common electrode lines and a common electrode signal line which is disposed in a non-display region on the array substrate. Each of the gate lines corresponds to one common electrode line. Each of the common electrode lines is electrically connected with the common electrode signal line through a corresponding signal line through-hole region. The signal line through-hole region is provided with at least one identification through hole, the signal line through-hole region is configured for indicating a number according to a position of the identification through hole. The array substrate can reduce the frame width of the display device.

20 Claims, 4 Drawing Sheets

(51) Int. Cl.
  *G02F 1/1362* (2006.01)
  *G02F 1/167* (2006.01)
  *G02F 1/1345* (2006.01)
  *G02F 1/1337* (2006.01)
  *G02F 1/1343* (2006.01)

(56) References Cited

U.S. PATENT DOCUMENTS

2011/0261307 A1  10/2011  Shin et al.
2012/0193630 A1*  8/2012  Ham ................ G02F 1/134309
                                                    257/59
2014/0160418 A1*  6/2014  Zhu ....................... G02F 1/1333
                                                    349/139
2014/0168559 A1*  6/2014  Zhu ................... G02F 1/136204
                                                    349/43
2015/0187810 A1*  7/2015  Lee ....................... H01L 51/524
                                                    349/42

FOREIGN PATENT DOCUMENTS

CN           102809851 A    12/2012
CN           103792733 A     5/2014
WO           2013181864 A1  12/2013

* cited by examiner

ARRAY SUBSTRATE AND DISPLAY DEVICE

The application is a U.S. National Phase Entry of International Application No. PCT/CN2014/084018 filed on Aug. 8, 2014, designating the United States of America and claiming priority to Chinese Patent Application No. 201410043732.9 filed on Jan. 29, 2014. The present application claims priority to and the benefit of the above-identified applications and the above-identified applications are incorporated by reference herein in their entirety.

TECHNICAL FIELD

At least one embodiment of the present disclosure relates to an array substrate and a display device.

BACKGROUND

Liquid crystal displays (LCDs) have currently occupied a dominant position in the field of flat panel display. Due to complex manufacturing process and large manufacturing difficulty of an LCD, the probability of line breakages in the LCD is very high. The line breakages in the LCD generally include the breakage of gate lines and the breakage of data lines. When the breakage of gate lines or the breakage of data lines occurs, it can be caused that an entire row or an entire column of pixels of the LCD can not work normally, and hence the image quality of the LCD can be affected.

In the structure of a thin-film transistor liquid crystal display (TFT-LCD), each gate line is provided with a gate line identification disposed on a signal input side of the gate line, and the gate line identification can be configured to repair the broken gate line. For instance, during a gate line repair, a repairer can determine a gate line to be repaired according to an identification that the gate line corresponds to, and then repair the gate line. The gate line identification can also be configured to detect an LCD panel. One gate line on an array substrate of the LCD corresponds to one row of pixels. During the detection, an inspector can determine the position of the row provided with the pixel to be detected, according to the gate line identification.

As illustrated in FIG. 1, gate line identifications generally form number-based specific shapes through gate-metal-layer deposition and etching, and are usually disposed on the side where gate signal generators (gate pads) 101 disposed in a non-display region of an array substrate and configured to provide signals for gate lines are located. In general, a special gate-line digital identification region 104 is disposed between a common electrode signal line 102 on the side where the gate pads 101 are located, and an active region 103, so as to arrange the gate line identifications.

SUMMARY

At least one embodiment of the present disclosure provides an array substrate and a display device, to reduce the frame width of the display device.

In one aspect, at least one embodiment of the present disclosure provides an array substrate, which comprises: a plurality of gate lines arranged in parallel, a plurality of common electrode lines and a common electrode signal line which is disposed in a non-display region of the array substrate. Each of the gate lines corresponds to one common electrode line. Each of the common electrode lines is electrically connected with the common electrode signal line through a corresponding signal line through-hole region. The signal line through-hole region is provided with at least one identification through hole, the signal line through-hole region is configured for indicating a number according to a position of the identification through hole. The number is configured for identifying a coordinate of a gate line that the signal line through-hole region corresponds to.

In another aspect, at least one embodiment of the present disclosure provides a display device, which comprises the above-mentioned array substrate.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Figure 1:
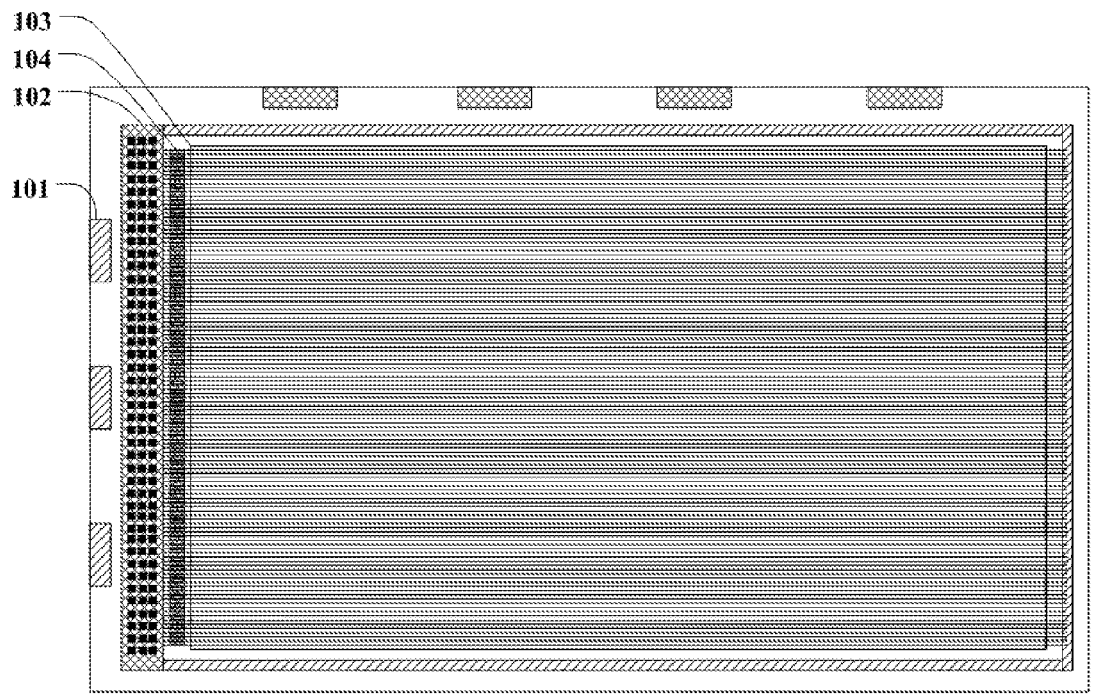
FIG. 1 is a schematic structural view of an array substrate.

The inventor of the application noted that: in the array substrate as illustrated in FIG. 1, because gate line identifications are generally disposed in a special gate-line digital identification region 104, the side where the gate pads of the array substrate are located is relatively wide, and hence the frame of the display device (e.g., LCD) employing the array substrate is relatively wide.

Figure 2:
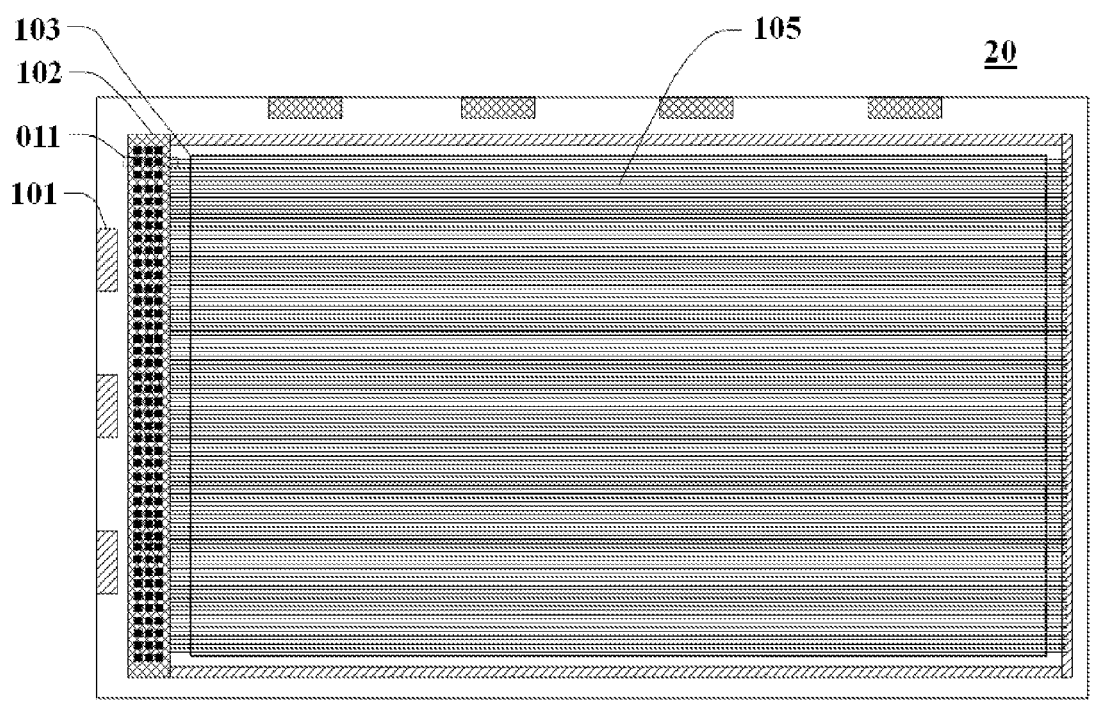
FIG. 2 is a schematic structural view of an array substrate provided by an embodiment of the present disclosure.
Figure 3:
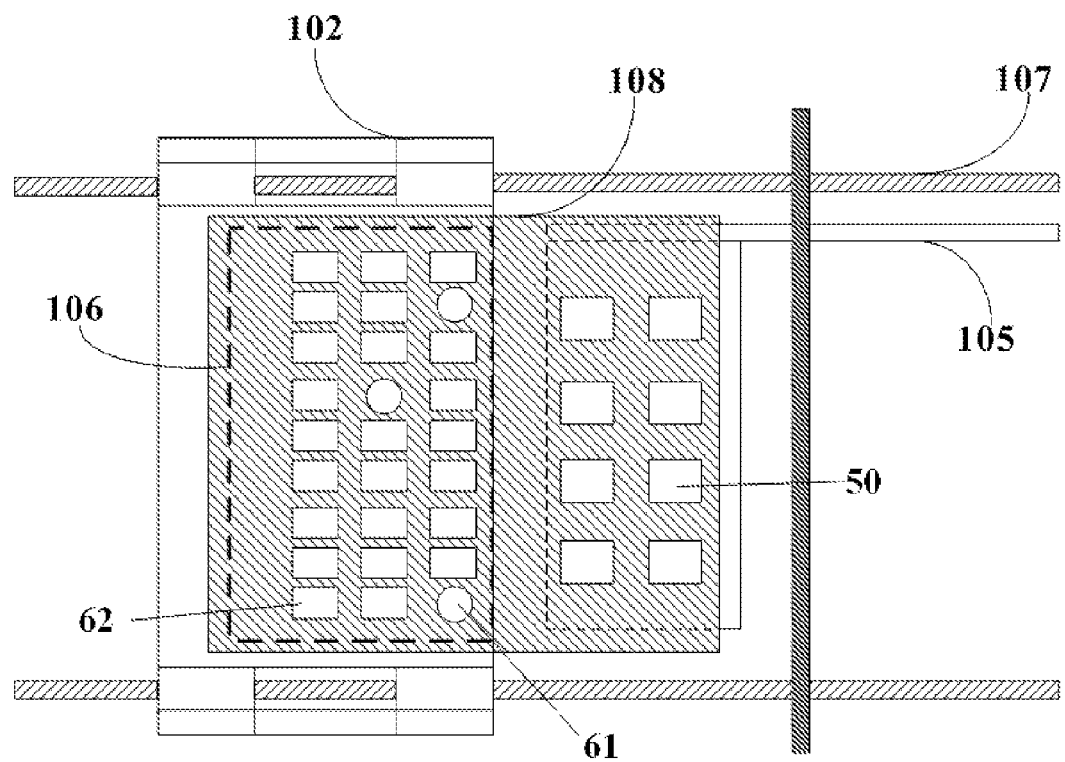
FIG. 3 is a partial enlarged view of an array substrate provided by an embodiment of the present disclosure.

At least one embodiment of the present disclosure provides an array substrate 20. As illustrated in FIGS. 2 and 3, the array substrate 20 comprises: a plurality of gate lines 107 and a plurality of common electrode lines 105 arranged in parallel, and further comprises a common electrode signal line 102 disposed in a non-display region outside a display region (namely an active region 103) on the array substrate 20 and configured to provide voltage signals for the common electrode lines 105. Each of the gate lines 107 corresponds to one common electrode line 105. Each of the common electrode lines 105 is electrically connected with the common electrode signal line 102 through a corresponding signal line through-hole region 106. Description will be given below by taking the case that the common electrode signal line 102 is disposed on the side where gate pads 101 of the array substrate are located as an example, but embodiments of the present disclosure is not limited thereto. For instance, the common electrode signal line 102 can also be disposed on the other side, opposite to the gate pads, of the non-display region.

It should be noted that: in the embodiment, the common electrode signal line 102 is arranged in the same layer as a source/drain (SD) layer of the array substrate 20 and the common electrode lines 105 are arranged in the same layer as the gate lines of the array substrate 20, so the common electrode lines 105 are connected with the common electrode signal line 102 via through holes correspondingly. That the common electrode lines 105 are connected with the common electrode signal line 102 via the through holes can further guarantee that the voltage of each common electrode line 105 is stably equal to the voltage of the common electrode signal line 102. For instance, each common electrode line 105 corresponds to a signal line through-hole region 106. The common electrode signal line 102 is electrically connected with a connecting metal layer 108 via through holes in the signal line through-hole region 106. The connecting metal layer 108 is electrically connected with the common electrode line 105 via the through holes 50, and thus the electrical connection between the common electrode signal line 102 and the common electrode line 105 can be achieved. In general, the connecting metal layer 108 can be made of conductive materials such as indium tin oxide (ITO) and metal aluminum. For instance, when the connecting metal layer 108 is made of ITO material, the connecting metal layer 108 can be formed at the same time with pixel electrodes on the array substrate 20.

FIG. 3 is an enlarged view of a region 011 in FIG. 2. In the figure, circular through holes are identification through holes 61, and square through holes are non-identification through holes 62. As seen from FIG. 3, the signal line through-hole region 106 is provided with at least one identification through hole 61, so that the signal line through-hole region 106 can indicate a number according to the position of the identification through hole 61. The number is used for identifying the coordinate of the gate line 107 that the signal line through-hole region 106 corresponds to. As illustrated in FIG. 3, the common electrode signal line 102 can be electrically connected with the connecting metal layer 108 via a plurality of through holes. The region where the plurality of through holes are located is the signal line through-hole region 106. Subsequently, the connecting metal layer 108 is electrically connected with the common electrode line 105 via a plurality of through holes 50, and this can guarantee that the voltage of each common electrode line 105 is stably equal to the voltage of the common electrode signal line 102.

In one embodiment, the common electrode signal line 102 can be electrically connected with a connecting metal layer 108 through a signal line through-hole region 106, and the connecting metal layer 108 is electrically connected with a common electrode line 105 via a plurality of through holes 50. The common electrode line 105 corresponds to a gate line 107, so that there is also a corresponding relationship between the gate line 107 the signal line through-hole region 106, and hence each gate line has a corresponding signal line through-hole region. Therefore, when the number indicated by the signal line through-hole region that each gate line corresponds to is arranged according to the sequence of the gate line, the coordinate of the gate line in the array substrate 20 can be indicated. When line breakage or poor contact occurs to a gate line, the position of the gate line can be determined through the coordinate of gate line, indicated by the signal line through-hole region that the gate line corresponds to, so as to facilitate the detection or maintenance.

It should be noted that the identification through hole can be a through hole with the shape different from that of a non-identification through hole. For instance, the identification through hole can be circular, triangular or the like, and the present disclosure is not limited thereto; and the identification through hole can also be a through hole with the color different from that of a non-identification through hole.

In this case, because the signal line through-hole region is provided with at least one identification through hole, the signal line through-hole region can indicate a number by means of the identification through hole. In the array substrate, the positions of different gate lines can be distinguished through the numbers indicated by different signal line through-hole regions. Compared with the case of distinguishing the positions of different gate lines by forming numbers at predetermined positions by metal etching, the case of directly distinguishing through the through holes in the signal line through-hole regions does not need to occupy the space on the edge of the array substrate and hence reduces the frame width of the display device employing the array substrate.

Figure 4:
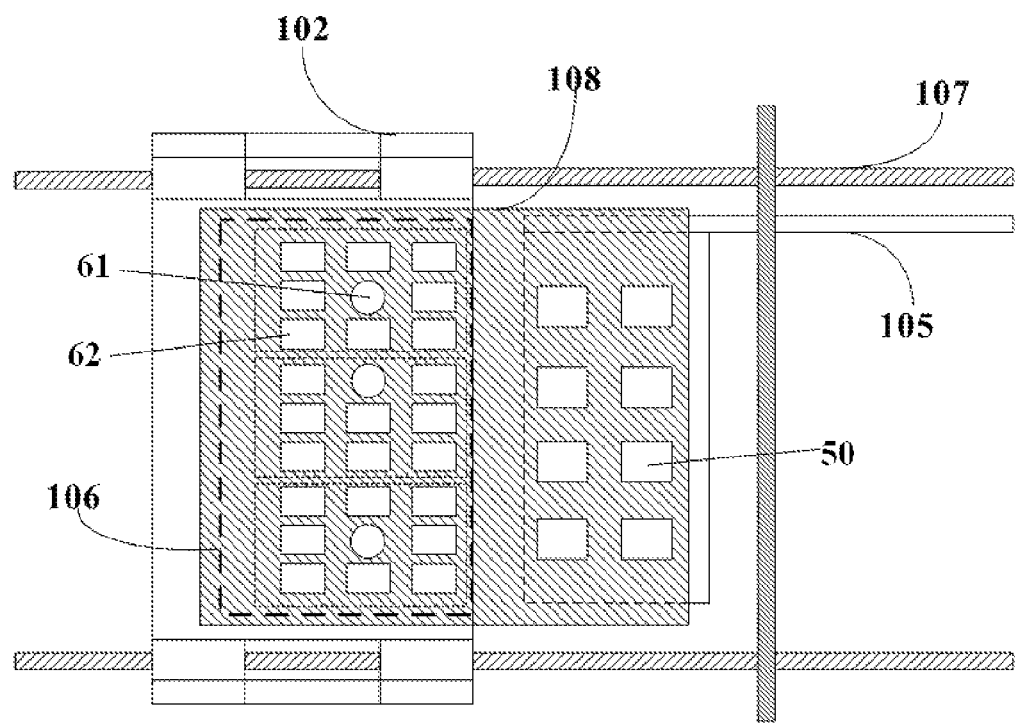
FIG. 4 is a partial enlarged view of another array substrate provided by an embodiment of the present disclosure.

In one embodiment, as illustrated in FIG. 4 which is an enlarged view of a region 011 of an array substrate 20 illustrated in FIG. 2, circular through holes in the figure are identification through holes 61 and square through holes are non-identification through holes 62. A signal line through-hole region 106 corresponding to a gate line 107 can be provided with N through hole groups (the quantity of through hole groups is N), namely the through holes in the signal line through-hole region 106 can be divided into N groups. N is an integer greater than or equal to 1, and each group is referred to as a through hole group. Each of the through hole groups includes an identification through hole and/or a non-identification through hole. A non-identification through hole refers to a through hole in the through hole group except the identification through hole. The N through hole groups include at least one identification through hole 61. Each of the through hole groups can indicate a number. Thus, the coordinate of the gate line 107 can be identified by the number indicated by the signal line through-hole region 106.

In various embodiments, the through hole group can indicate a number according to at least one or a combination selected from the group consisting of a predetermined pattern formed in the through hole group by the identification through hole, the position sequence of the identification through hole in the through hole group, the number of the identification through hole in the through hole group, and a number represented by the identification through hole.

Figure 5:
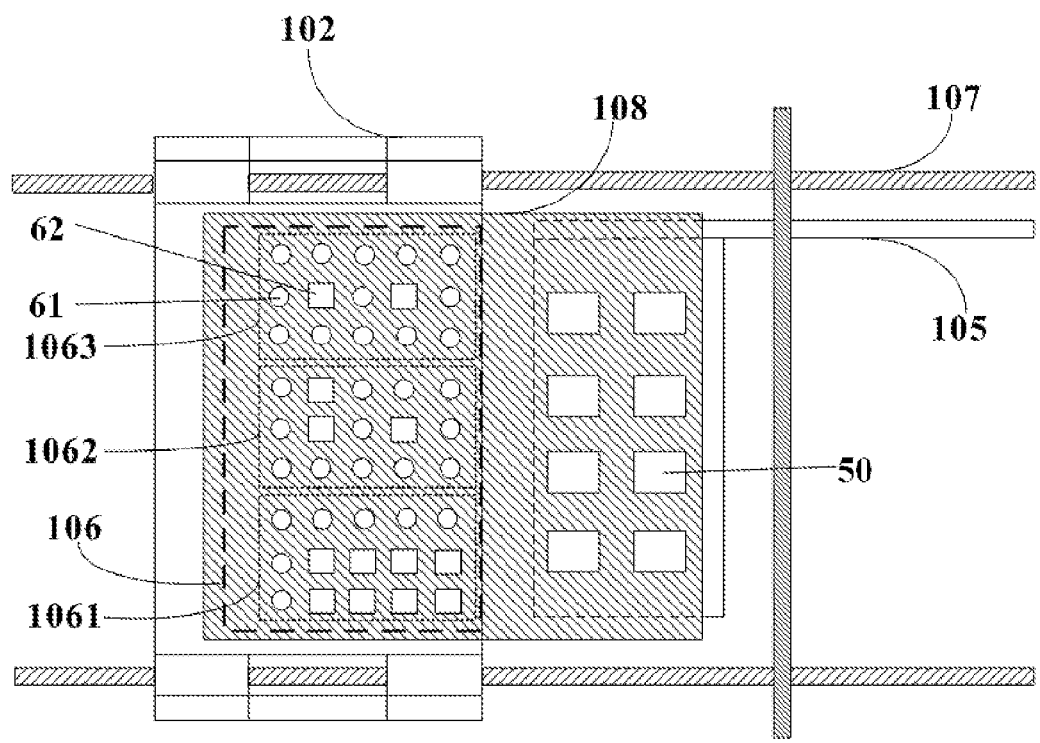
FIG. 5 is a partial enlarged view of still another array substrate provided by an embodiment of the present disclosure.

In one embodiment, the through hole group can indicate a number according to a predetermined pattern formed in the through hole group by the identification through hole. As illustrated in FIG. 5 which is an enlarged view of a region 011 of another array substrate illustrated in FIG. 2, circular through holes in the figure are identification through holes 61 and square through holes are non-identification through holes 62. A signal line through-hole region 106 corresponding to a gate line 107 is provided with three through hole groups which are respectively a through hole group 1061, a through hole group 1062 and a through hole group 1063. Each through hole group includes 15 through holes. In one embodiment, when the number indicated by the through hole group is a decimal number, a predetermined pattern can be formed by the identification through holes 61 and can be used for representing a number. For instance, the predetermined pattern can be a number and can also be other pattern. In one embodiment, when the number indicated by the through hole group is a hexadecimal number, the predetermined pattern can also be a letter. The letter can have a same meaning or a different meaning with the correponding letter in the hexadecimal number system. The present disclosure is not limited thereto. Each of the through hole groups includes 15 through holes. The 15 through holes are arranged in five columns which are respectively the first column, the second column, the third column, the fourth column and the fifth column from left to right. Through holes in the first column are arranged from the bottom up; through holes in the second column are arranged from the bottom up on the basis of the through holes in the first column; through holes in the third column are arranged from the bottom up on the basis of the through holes in the second column; the rest through holes are arranged similarly. Therefore, the through holes in the first column are respectively the first through hole, the second through hole and the third through from the bottom up; the through holes in the second column are respectively the fourth through hole, the fifth through hole and the sixth through hole from the bottom up; the through holes in the third column are respectively the seventh through hole, the eighth through hole and the ninth through hole from the bottom up; the through holes in the fourth column are respectively the tenth through hole, the eleventh through hole and the twelfth through hole from the bottom up; and the through holes in the fifth column are respectively the thirteenth through hole, the fourteenth through hole and the fifteenth through hole from the bottom up. In one embodiment, the number indicated by the through hole group 1061 is a number at hundreds place in the decimal digit; the number indicated by the through hole group 1062 is a number at tens place in the decimal digit; and the number indicated by the through hole group 1063 is a number at the unit place in the decimal digit.

For instance, the first through hole, the second through hole, the third through hole, the sixth through hole, the ninth through hole, the twelfth through hole and the fifteenth through hole in the 15 through holes in the through hole group 1061, as illustrated in FIG. 5, are circular identification through holes 61; and when observed from the display region side with the sight line parallel to the gate line 107, the circular identification through holes 61 can form the shape of a number 7. The first through hole, the second through hole, the third through hole, the fourth through hole, the seventh through hole, the eighth through hole, the ninth through hole, the tenth through hole, the twelfth through hole, the thirteenth through hole, the fourteenth through hole and the fifteenth through hole in the 15 through holes in the through hole group 1062 are circular identification through holes 61; and when observed from the display region side with the line of sight parallel to the gate line 107, the circular identification through holes 61 can form the shape of a number 6. The first through hole, the second through hole, the third through hole, the fourth through hole, the sixth through hole, the seventh through hole, the eighth through hole, the ninth through hole, the tenth through hole, the twelfth through hole, the thirteenth through hole, the fourteenth through hole and the fifteenth through hole in the 15 through holes in the through hole group 1063 are circular identification through holes 61; and when observed from the display region side with the line of sight parallel to the gate line 107, the circular identification through holes 61 can form the shape of a number 8. Therefore, the gate line coordinate of the gate line 107, indicated by the signal line through-hole region 106, is 768, namely the gate line 107 is the 768th gate line.

In one embodiment, the through hole group can indicate a number according to a combination of the position sequence of the identification through hole in the through hole group and the number of the identification through hole in the through hole group. For instance, the N through hole groups include at least one first through hole group provided with at least one identification through hole, and the first through hole group each comprises 9 through holes. When the $(x)^{th}$ through hole of the 9 through holes is an identification through hole, the first through hole group indicates the number x, which is any number from 1 to 9. When a through holes of the 9 through holes are identification through holes (in the 9 through holes, the quantity of identification through holes is a), the first through hole group indicates the number 0, and a refers to any number from 0 to 9 except 1. For instance, when a is 9 or 0, namely the first through hole group is provided with 9 identification through holes or 0 identification through hole, the first through hole group indicates the number 0. A combination of the numbers which are respectively indicated by the N through hole groups in the signal line through-hole region 106 is a decimal number.

Figure 6:
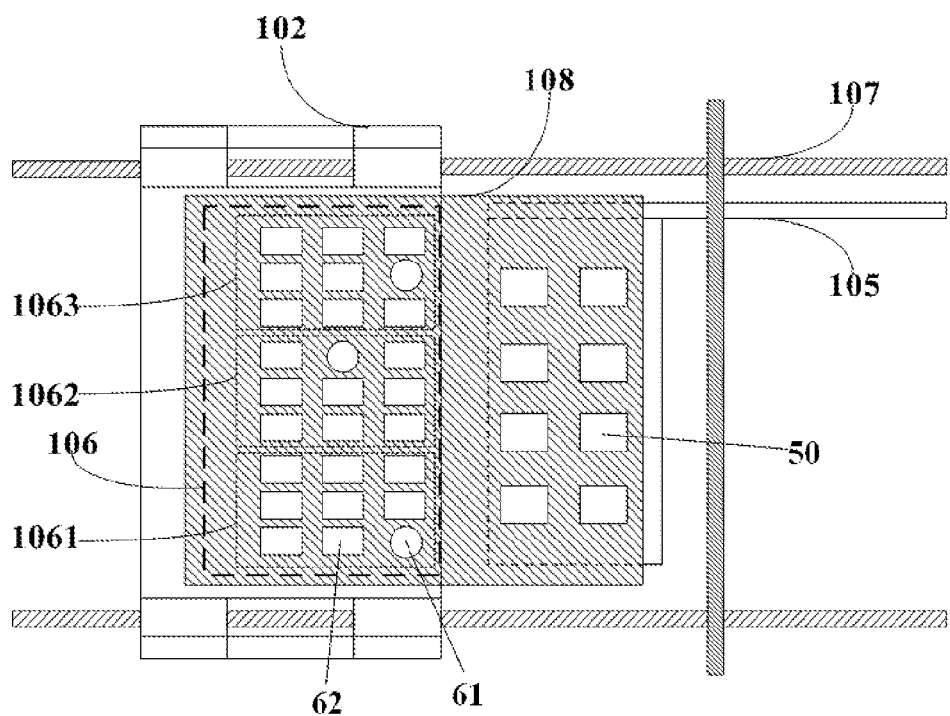
FIG. 6 is a partial enlarged view of still another array substrate provided by an embodiment of the present disclosure.

For instance, as illustrated in FIG. 6 which is an enlarged view of a region 011 of still another array substrate 20 illustrated in FIG. 2, circular through holes in the figure are identification through holes 61 and square through holes are non-identification through holes 62. A signal line through-hole region 106 corresponding to a gate line 107 is provided with three through hole groups which are respectively a through hole group 1061, a through hole group 1062 and a through hole group 1063. The three through hole groups are all first through hole groups. Each of the through hole groups includes 9 through holes. The 9 through holes are arranged in three columns which are respectively the first column, the second column and the third column from left to right. Through holes in the first column are arranged from the bottom up; through holes in the second column are arranged from the bottom up on the basis of the through holes in the first column; and through holes in the third column are arranged from the bottom up on the basis of the through holes in the second column. Therefore, the through holes in the first column are respectively the first through hole, the second through hole and the third through hole from the bottom up; the through holes in the second column are respectively the fourth through hole, the fifth through hole and the sixth through hole from the bottom up; and the through holes in the third column are respectively the seventh through hole, the eighth through hole and the ninth through hole from the bottom up. Therefore, each through hole group can indicate a different number according to the position of the identification through hole. For instance, the seventh through hole in the through hole group 1061 illustrated in FIG. 6 is an identification through hole 61, so the number indicated by the through hole group 1061 is 7; the sixth through hole in the through hole group 1062 is an identification through hole 61, so the number indicated by the through hole group 1062 is 6; and the eighth through hole in the through hole group 1063 is an identification through hole 61, so the number indicated by the through hole group 1063 is 8. Therefore, the gate line coordinate of the gate line 107, indicated by the signal line through-hole region 106, is 768, namely the gate line 107 is the 768th gate line.

It should be noted that the sequences of the through holes and the through hole groups are only illustrative in the embodiments of the present disclosure and can be arranged in actual application according to specific conditions. The embodiments of the present disclosure is not limited thereto.

In one embodiment, the through hole group can indicate a number according to the number of the identification through holes in the through hole group. For instance, when the 9 through holes includes y identification through holes (in the 9 through holes, the quantity of identification through holes is y), the number indicated by the first through hole group is the number y, which is any number from 1 to 9; and when the first through hole group is provided with 0 identification through hole, the first through hole group indicates the number 0. A combination of the numbers which are respectively indicated by the N through hole groups is a decimal number.

Figure 7:
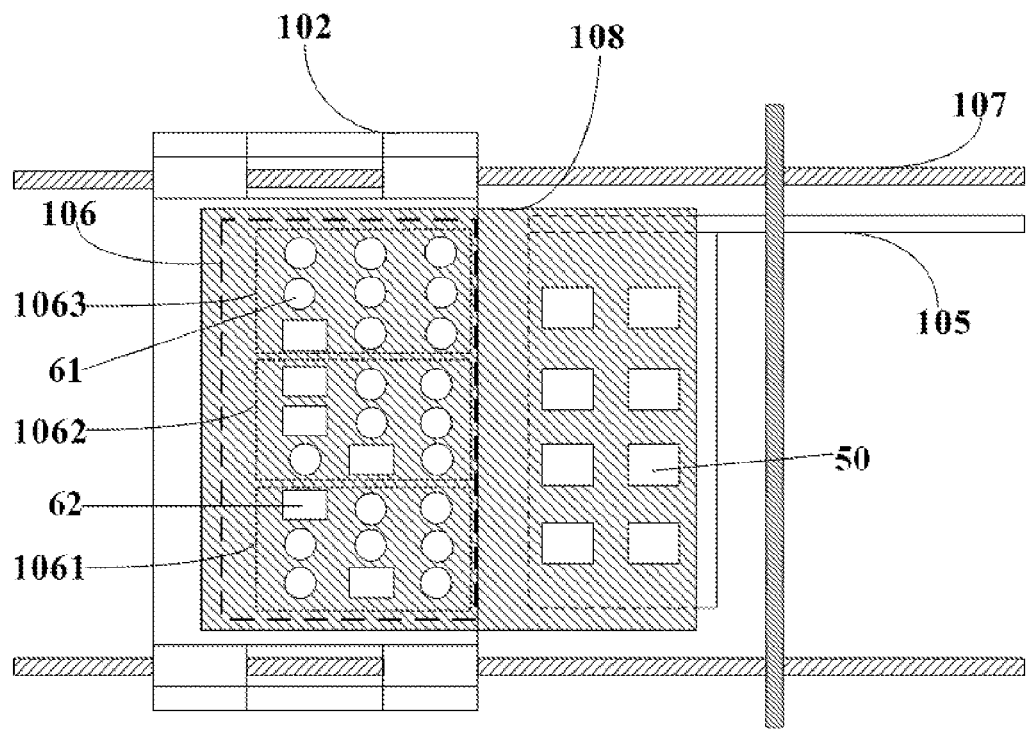
FIG. 7 is a partial enlarged view of still another array substrate provided by an embodiment of the present disclosure.

For instance, as illustrated in FIG. 7 which is an enlarged view of a region 011 of still another array substrate 20 illustrated in FIG. 2, circular through holes in the figure are identification through holes 61 and square through holes are non-identification through holes 62. A signal line through-hole region 106 corresponding to a gate line 107 is provided with three through hole groups which are respectively a through hole group 1061, a through hole group 1062 and a through hole group 1063. The three through hole groups are all first through hole groups. Each through hole group includes 9 through holes. The 9 through holes are arranged in three columns. Each column is provided with three through holes. A number can be indicated according to the number of the identification through holes in each through hole group. As illustrated in FIG. 7, the through hole group 1061 includes 7 identification through holes 61, so the number indicated by the through hole group 1061 is 7; the through hole group 1062 includes 6 identification through holes 61, so the number indicated by the through hole group 1062 is 6; and the through hole group 1063 includes 8 identification through holes 61, so the number indicated by the through hole group 1063 is 8. Therefore, the gate line coordinate of the gate line 107, indicated by the signal line through-hole region 106, is 768, namely the gate line 107 is the 768th gate line.

In various embodiments, a combination of the numbers which are respectively indicated by the N through hole groups can also be an octal number or a hexadecimal number.

For instance, the N through hole groups include at least one first through hole group. Each first through hole group can include F through holes arranged in sequence, and F can be 7 or 15. When the $(z)^{th}$ through hole in the F through holes is an identification through hole, the first through hole group indicates the number z. For instance, when F is 7, z indicates any number from 1 to 7; and when F is 15, z indicates any number from 1 to 15. When b through holes of the F through holes are identification through holes (in the F through holes, the quantity of identification through holes is b), the number indicated by the first through hole group is 0, and b is any number from 0 to F except 1. For instance, when b is F or 0, namely the first through hole group is provided with F identification through holes or 0 identification through hole, the first through hole group indicates the number 0. A combination of the numbers which are respectively indicated by the N through hole groups is an (F+1) system number. The identification method of the (F+1) system number can be referred to the illustration of FIG. 6. No further description will be given here to the embodiment of the present disclosure.

For instance, the N through hole groups include at least one first through hole group. Each first through hole group can also include Q through holes arranged in sequence, and Q is 7 or 15. When the Q through holes include w identification through holes (the quantity of identification through holes is w), the first through hole group indicates the number w. When Q is 7, the w indicates any number from 1 to 7. When Q is 15, the w indicates any number from 1 to 15. When the first through hole group is provided with 0 identification through hole, the first through hole group indicates the number 0. A combination of the numbers which are respectively indicated by the N through hole groups is a (Q+1) system number. The identification method of the (Q+1) system number can be referred to the illustration of FIG. 6. No further description will be given here to the embodiment of the present disclosure.

Figure 8:
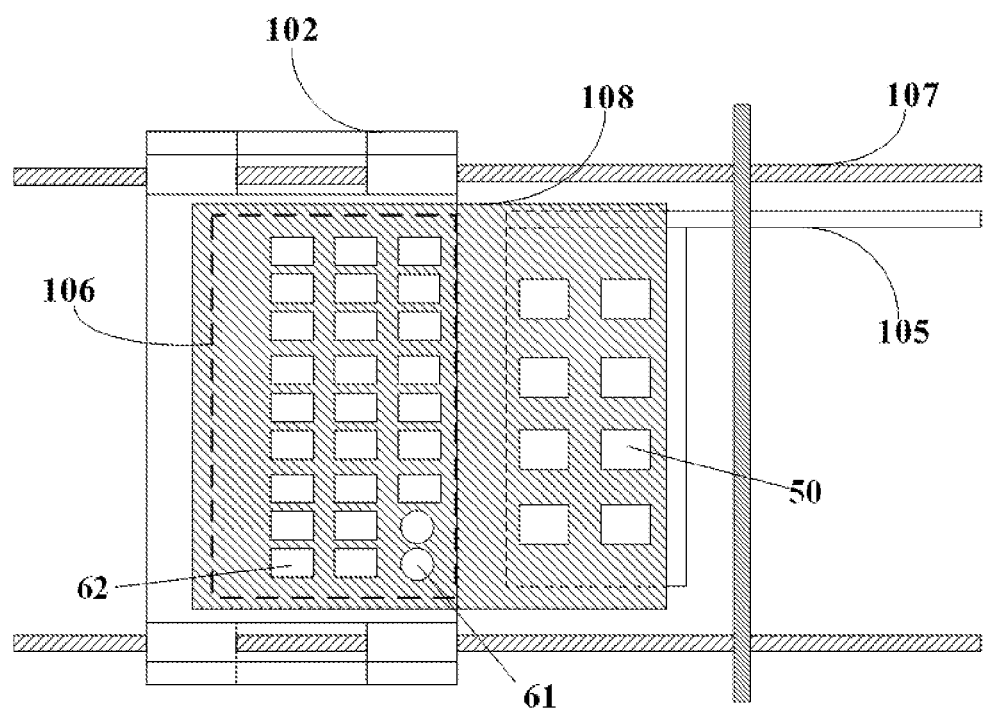
FIG. 8 is a partial enlarged view of still another array substrate provided by an embodiment of the present disclosure.

In one embodiment, the through hole group can indicate a number according to a combination of the position sequence of the identification through hole in the through hole group and a number represented by the identification through hole. For instance, the number indicated by the signal line through-hole region 106 is a binary number, namely the signal line through-hole region 106 includes M through holes (the quantity of through holes is M) and each of the M through holes respectively represents a different digit position in the binary system. The M through holes includes at least one identification through hole 61. The number at a digit position in the binary system, indicated by the identification through hole 61 is 1. Thus, the number indicated by the M through holes can be taken as a binary sequence and is any number from 0 to $2^M$. For instance, as illustrated in FIG. 8 which is a partial enlarged view of still another array substrate, the M=27, and 27 through holes are divided into 3 columns which are respectively the first column, the second column and the third column from right to left. Through holes in the first column are respectively the first digit position to the ninth digit position in the binary system from from top to bottom; through holes in the second column are respectively the tenth digit position to the eighteenth digit position in the binary system from from top to bottom; and through holes of the third column are respectively the nineteenth digit position to the twenty-seventh digit position in the binary system from from top to bottom. If a through hole at a position is an identification through hole 61, the number at a digit position in the binary system, corresponding to the position, is 1. If the through hole at the position is a non-identification through hole 62, the number at a digit position in the binary system, corresponding to the position, is 0. As illustrated in FIG. 8, the signal line through-hole region 106 is provided with 27 through holes, so the signal line through-hole region 106 can be any number from 0 to $2^{27}$. For instance, the eighth through hole and the ninth through hole in FIG. 8 are identification through holes 61, the binary number indicated by the signal line through-hole region 106 illustrated in FIG. 8 is 000000000000000000110000000, which is 768 when converted to a decimal number. Therefore, the gate line coordinate of the gate line 107, indicated by the signal line through-hole region 106, is 768, namely the gate line 107 is the 768th gate line.

In the array substrate provided by at least one embodiment, the signal line through-hole region can indicate a number and is electrically connected with a common electrode line through a connecting metal layer; the common electrode line corresponds to one gate line; and thus the number indicated by the signal line through-hole region can identify the coordinate of the gate line. It does not need to occupy the space on the array substrate to identify the coordinate of a gate line through a signal line through-hole region, and the frame width of the display device employing the array substrate can be reduced.

At least one embodiment of the present disclosure provides a display device, which comprises: the array substrate provided by any one of the above-mentioned embodiments. The array substrate adopts a signal line through-hole region to identify the coordinate of a gate line and hence does not occupy the space of the array substrate.

In the display device provided by the embodiment of the present disclosure, a signal line through-hole region can indicate a number and is electrically connected with a common electrode line through a connecting metal layer; the common electrode line corresponds to one gate line; and the number indicated by the signal line through-hole region can identify the coordinate of the gate line. It does not need to occupy the space on the array substrate to identify the coordinate of the gate line by the signal line through-hole region, and the frame width of the display device employing the array substrate can be reduced.

The descriptions above are only embodiments of the present disclosure and not intended to limit the scope of the present disclosure. Any variations or equivalents which can be easily conceived by those skilled in the art within the technical scope disclosed by the present disclosure shall fall within the scope of the present disclosure. Therefore, the scope of the present disclosure shall be defined by the appended claims.

The application claims benefit of Chinese Patent Application No. 201410043732.9, filed on Jan. 29, 2014, which is hereby entirely incorporated by reference as a part of the present application.

What is claimed is:

1. An array substrate, comprising: a plurality of gate lines arranged in parallel, a plurality of common electrode lines, and a common electrode signal line which is disposed in a non-display region on the array substrate, wherein
each of the gate lines corresponds to one common electrode line; each of the common electrode lines is electrically connected with the common electrode signal line through a corresponding signal line through-hole region; the signal line through-hole region is provided with at least one identification through hole, the signal line through-hole region is configured for indicating a number according to a position of the at least one identification through hole; and the number is configured for identifying a coordinate of a gate line that the signal line through-hole region corresponds to.

2. The array substrate according to claim 1, wherein
the signal line through-hole region is provided with N through hole groups; each of the through hole groups comprises an identification through hole and/or a non-identification through hole; the non-identification through hole refers to a through hole in the through hole group except the identification through hole; and the N through hole groups comprise the at least one identification through hole;
where N is an integer greater than or equal to 1; and each of the through hole groups is configured for indicating a number by means of the identification through hole and/or the non-identification through hole.

3. The array substrate according to claim 2, wherein the through hole group indicates the number according to at least one or a combination selected from the group consisting of a predetermined pattern formed in the through hole group by the identification through hole, a position sequence of the identification through hole in the through hole group, a number of the identification through hole in the through hole group, and a number represented by the identification through hole.

4. The array substrate according to claim 3, wherein the through hole group comprises at least one identification through hole; and
where the number indicated by the through hole group is a hexadecimal number, the predetermined pattern is a letter.

5. The array substrate according to claim 3, wherein the through hole group comprises at least one identification through hole; and where the number indicated by the through hole group is a decimal number, the at least one identification through hole forms a predetermined pattern which is a number.

6. The array substrate according to claim 3, wherein
the N through hole groups comprise at least one first through hole group, and the first through hole group each comprises 9 through holes arranged in sequence;
where an $x^{th}$ through hole of the 9 through holes is an identification through hole, a number indicated by the first through hole group is x, which is any number from 1 to 9;
where a, in number, of the 9 through holes are identification through holes, the number indicated by the first through hole group is 0, and a is any number from 0 to 9 except 1; and
a combination of numbers which are respectively indicated by the N through hole groups is a decimal number.

7. The array substrate according to claim 3, wherein
the N through hole groups comprise at least one first through hole group, and the first through hole group each comprises 9 through holes arranged in sequence;
where the 9 through holes comprise y identification through holes, a number indicated by the first through hole group is y, which is any number from 1 to 9;
where the first through hole group is provided with 0 identification through hole, the number indicated by the first through hole group is 0; and
a combination of numbers which are respectively indicated by the N through hole groups is a decimal number.

8. The array substrate according to claim 3, wherein
the N through hole groups comprise at least one first through hole group, the first through hole group each comprises F through holes arranged in sequence, and F is 7 or 15;
where a $z^{th}$ through hole of the F through holes is an identification through hole, a number indicated by the first through hole group is z;
where F is 7, z indicates any number from 1 to 7;
where F is 15, z indicates any number from 1 to 15;
where b through holes of the F through holes are identification through holes, the number indicated by the first through hole group is 0, and b is any number from 0 to F except 1; and
a combination of numbers which are respectively indicated by the N through hole groups is an (F+1) system number.

9. The array substrate according to claim 3, wherein
the N through hole groups comprise at least one first through hole group, the first through hole group each comprises Q through holes arranged in sequence, and Q is 7 or 15;
where Q through holes comprise w identification through holes, a number indicated by the first through hole group is w;
where Q is 7, the w indicates any number from 1 to 7;
where Q is 15, w indicates any number from 1 to 15;
where the first through hole group is provided with 0 identification through hole, the number indicated by the first through hole group is 0; and
a combination of numbers which are respectively indicated by the N through hole groups is a (Q+1) system number.

10. The array substrate according to claim 2, wherein the through hole group comprises at least one identification through hole; and
where the number indicated by the through hole group is a decimal number, the at least one identification through hole forms a predetermined pattern which is a number.

11. The array substrate according to claim 2, wherein
the N through hole groups comprise at least one first through hole group, and the first through hole group each comprises 9 through holes arranged in sequence;
where an $x^{th}$ through hole of the 9 through holes is an identification through hole, a number indicated by the first through hole group is x, which is any number from 1 to 9;
where a, in number, of the 9 through holes are identification through holes, the number indicated by the first through hole group is 0, and a is any number from 0 to 9 except 1; and
a combination of numbers which are respectively indicated by the N through hole groups is a decimal number.

12. The array substrate according to claim 11, wherein
where a is 9 or 0, the first through hole group is provided with 9 identification through holes or 0 identification through hole correspondingly, and the number indicated by the first through hole group is 0.

13. The array substrate according to claim wherein
the N through hole groups comprise at least one first through hole group, and the first through hole group each comprises 9 through holes arranged in sequence;
where the 9 through holes comprise y identification through holes, a number indicated by the first through hole group is y, which is any number from 1 to 9;
where the first through hole group is provided with 0 identification through hole, the number indicated by the first through hole group is 0; and
a combination of numbers which are respectively indicated by the N through hole groups is a decimal number.

14. The array substrate according to claim 2, wherein
the N through hole groups comprise at least one first through hole group, the first through hole group each comprises F through holes arranged in sequence, and F is 7 or 15;
where a $z^{th}$ through hole of the F through holes is an identification through hole, a number indicated by the first through hole group is z;
where F is 7, z indicates any number from 1 to 7;
where F is 15, z indicates any number from 1 to 15;
where b through holes of the F through holes are identification through holes, the number indicated by the first through hole group is 0, and b is any number from 0 to F except 1; and
a combination of numbers which are respectively indicated by the N through hole groups is an (F+1) system number.

15. The array substrate according to claim 14, wherein
where b is F or 0, the first through hole group is provided with F identification through holes or 0 identification through hole correspondingly, and the number indicated by the first through hole group is 0.

16. The array substrate according to claim 2, wherein
the N through hole groups comprise at least one first through hole group, the first through hole group each comprises Q through holes arranged in sequence, and Q is 7 or 15;
where Q through holes comprise w identification through holes, a number indicated by the first through hole group is w;
where Q is 7, the w indicates any number from 1 to 7;
where Q is 15, w indicates any number from 1 to 15;
where the first through hole group is provided with 0 identification through hole, the number indicated by the first through hole group is 0; and
a combination of numbers which are respectively indicated by the N through hole groups is a (Q+1) system number.

17. The array substrate according to claim 2, wherein
the identification through hole and the non-identification through hole have different shapes or colors.

18. The array substrate according to claim 1, wherein
the signal line through-hole region comprises M through holes; the M through holes comprise at least one identification through hole; each of the M through holes respectively represents a different digit position in the binary system; a number at a digit position in the binary system, indicated by each identification through hole, is 1; and
a number indicated by the M through holes is any number from 0 to $2^M$.

19. The array substrate according to claim 1, wherein
each of the common electrode lines corresponds to one signal line through-hole region; the signal line through-hole region electrically connects the common electrode signal line and a connecting metal layer; and the connecting metal layer is electrically connected with the common electrode line.

20. A display device, comprising
the array substrate according to claim 1.

* * * * *